United States Patent [19]
Masaki et al.
[11] 3,909,636
[45] Sept. 30, 1975

[54] SEMICONDUCTOR LARGE SCALE INTEGRATED CIRCUIT CHIP HAVING CURRENT SWITCHING TYPE LOGICAL CIRCUITS

[75] Inventors: Akira Masaki, Kodaira; Yutaka Harada, Kokubunji, both of Japan

[73] Assignee: Hitachi, Ltd., Japan

[22] Filed: Mar. 26, 1974

[21] Appl. No.: 455,011

[30] Foreign Application Priority Data

Mar. 26, 1973 Japan ............ 48-33590

[52] U.S. Cl. ............ 307/303; 307/203; 307/207; 307/213; 307/215; 357/40; 357/43

[51] Int. Cl.[2] ............ H03K 19/08; H01L 27/02

[58] Field of Search ............ 307/213, 303, 203, 207, 307/215; 357/40, 43

[56] References Cited

UNITED STATES PATENTS 3,378,695 4/1968 Marette ............ 307/213 X
3,708,691 1/1973 Gilbert ............ 307/303 X
3,760,200 9/1973 Taniguchi et al. ............ 307/303

*Primary Examiner*—John Zazworsky
*Attorney, Agent, or Firm*—Craig & Antonelli

[57] ABSTRACT

A semiconductor large scale integrated circuit chip is characterized in that current switching type logical circuits are arranged at the central part of the chip, each of the logical circuits having a current source which is so constructed as to be capable of changing its current value through a change in its connection. Emitter-follower transistors are arranged at the peripheral part of the chip, each of the emitter-follower transistors receiving the output of the current switching type logical circuit as its base input, and a resistor as a load resistor of the current switching type logical circuit is connected to the base of the transistor.

13 Claims, 3 Drawing Figures

SEMICONDUCTOR LARGE SCALE INTEGRATED CIRCUIT CHIP HAVING CURRENT SWITCHING TYPE LOGICAL CIRCUITS

BACKGROUND OF THE INVENTION

The present invention relates to a semiconductor integrated circuit chip, and more particularly to improvements in a semiconductor large scale integrated circuit chip which is constructed with current switching type logical circuits (or current mode logic circuits to be hereinafter abbreviated to "CML circuits") and by the master slice method.

In the semiconductor large scale integrated circuit chip of this type, a plurality of CML gates are arranged at the central portion, while a plurality of emitter-follower transistors for the outputs are arranged at the peripheral portion.

In order to derive an output from the CML gate outside of the chip, the output terminal of the CML gate is connected to the input terminal of the output emitter-follower transistor, the output terminal of the transistor is connected to a pad, and the output is taken out from the pad to the exterior of the chip.

Since a large load capacity outside the chip is to be driven with the output, a comparatively high current of about 20 mA flows through the emitter-follower transistor, and the voltage drop across the collector load resistor of the CML gate due to the base current of the transistor becomes large. It is, therefore, impossible to obtain a fixed output voltage.

In order to diminish this voltage drop, the collector load resistance must be low. In this case, however, the CML gate dissipates a comparatively large amount of power.

For this reason, it has hitherto been proposed that each CML gate be provided with two types of collector load resistors and current source resistors, the two types being respectively used for a large current and for a small current. Only in the CML gates for driving the chip outputs is a resistor for a large current used so as to cause a large current to flow through the collector of the CML gate. In the CML gates for internal connections of the chip, the resistor for a small current is used so as to cause the small current to flow through the collector of such CML gate.

With the construction, however, it is necessary to prepare the many resistors for each CML gate, and hence, the area which each CML gate occupies on the chip is large. Disadvantageously, it is accordingly impossible to make the chip area small and to achieve a high density of integration.

SUMMARY OF THE INVENTION

An object of the present invention is to provide a semiconductor large scale integrated circuit chip which makes the chip area small and attains a high density of integration without spoiling the effect of reducing the power dissipation.

In order to accomplish such object, according to the present invention, a collector load resistor for a large current is provided at the base of each output emitter-follower transistor arranged at the peripheral portion of the chip.

DETAILED DESCRIPTION

Figure 1:
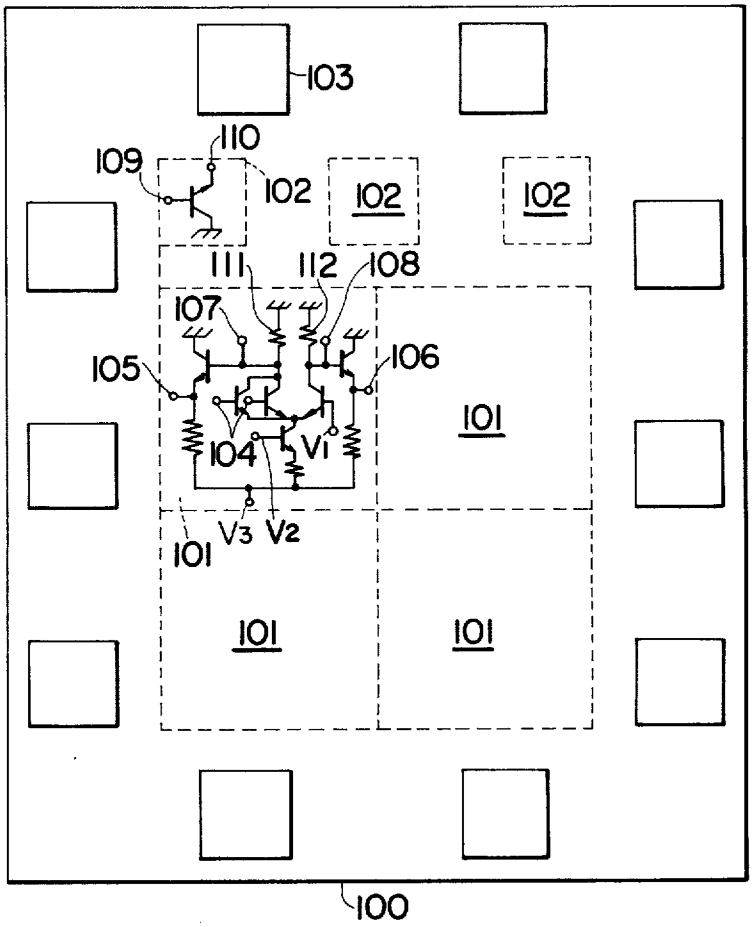
FIG. 1 PRIOR ART
FIG. 1 is a diagram showing the construction of a prior-art semiconductor integrated circuit chip.

One form of a prior-art semiconductor large scale integrated circuit chip is shown in FIG. 1.

A plurality of CML gates 101 are arranged at the central portion of a chip 100. At the peripheral portion of the chip 100, emitter-follower transistors 102 for outputs and input/output pads 103 are arranged.

The CML gate 101 has input terminals 104, output terminals 105 – 108, power source terminals $V_1$ – $V_3$, a plurality of transistors, and resistors 111, 112, etc. The output emitter-follower transistor 102 has an input terminal 109 and an output terminal 110. The input terminals 104 and 109, the output terminals 105 – 108 and 110 and the input/output pads 103 are interconnected in conformity with predetermined logic patterns.

In order to derive an output from the CML gate 101 outside of the chip 100, the output terminal 107 or 108 of the CML gate 101 is connected to the input terminal 109 of the output emitter-follower transistor 102, the output terminal 110 of the transistor 102 is connected to the input/output pad 103, and the output is taken out from the pad 103 to the exterior of the chip 100. Since a large load capacity outside the chip 100 is to be driven with the output, the transistor 102 is so designed as to be capable of causing a high current to flow therethrough. The output terminals 105 and 106 of the CML gate 101 serve for the interconnections inside the chip.

Where a load of, for example, 50 Ω is driven by the output of the transistor 102, a current as comparatively high as 20 mA flows through the transistor 102, and the voltage drop of the collector load resistor 111 or 112 of the CML gate 101 due to its base current becomes large. It is, therefore, impossible to obtain a fixed output voltage. In order to reduce such a voltage drop, the resistances of the collector load resistors 111 and 112 must be comparatively low.

However, where the resistances of the collector load resistors 111 and 112 are low, the CML gate 101 dissipates a comparatively large amount of power, in order to obtain a fixed output amplitude. On the other hand, since the operating temperature of the chip 100 must be held below a certain value in order to ensure proper circuit operation and reliability, the total power applied to the chip 100 has an upper-limit value. As a consequence, the number of CML gates 101 which can be assembled within the chip 100 becomes small, and a high density of integration becomes difficult.

Figure 2:
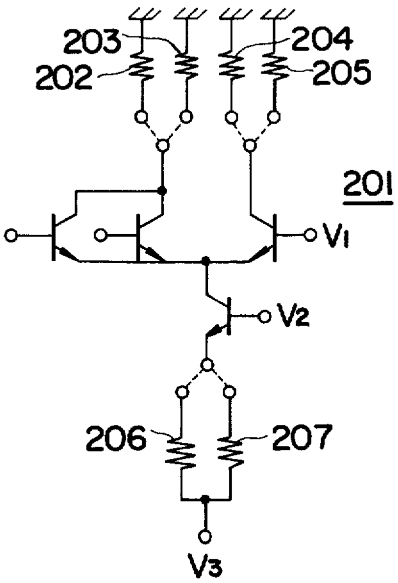
FIG. 2 PRIOR ART
FIG. 2 is a diagram showing the construction of a part of another prior-art semiconductor integrated circuit chip.

A configuration has therefore been hitherto proposed in which, as shown in FIG. 2, two types of resistors, are for a large current and one for a small current, are provided as the collector load resistors and current source resistors of a CML gate 201. Only in the CML gates for driving a chip output, is the resistor for a large current connected, so as to cause a large current to flow through the collector, while in the remaining CML gates for the interior of the chip, a resistor for a small current is connected, so as to cause a small current to flow through the collector.

More specifically, collector load resistors 202 and 204 and a current source resistor 206 are for large currents and have low resistance values. Collector load resistors 203 and 205 and a current source resistor 207 are for small currents and have high resistance values. The CML gate for driving the output uses the resistors 202, 204 and 206, while the CML gate for the interior of the chip uses the resistors 203, 205 and 207.

With such a construction, however, many resistors must be prepared for each CML gate. Therefore, the chip area which is occupied by one CML gate is large, and the chip area cannot be made small.

Figure 3:
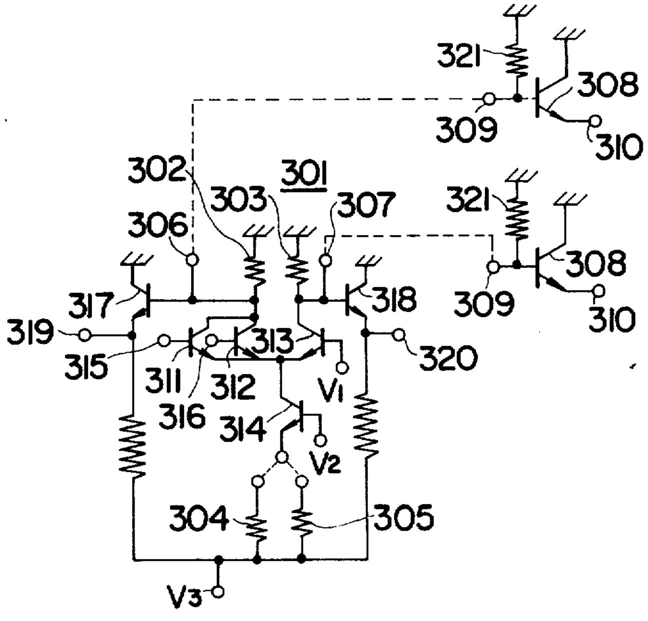
FIG. 3 is a diagram showing the construction of an embodiment of a semiconductor integrated circuit chip according to the present invention.

FIG. 3 shows an embodiment of the construction of the principal portion of a semiconductor large scale integrated circuit chip according to the present invention.

In the figure, reference numeral 301 designates a CML gate which is arranged at the central portion of a chip. In the CML gate, numerals 302 and 303 indicate resistors of a value ranging from several ten ohms to several thousand ohms, for small currents as collector load resistors. In one example, the value of resistors 302 and 303 may be 0.8K Ω. Numerals 304 and 305 represent resistors for a large current and a resistor for a small current as resistors for a current source, respectively. The value of resistor 304 may be 1.7K Ω while that of resistor 305 may be 3K Ω, for example. Output terminals 306 and 307 serve to take out outputs to the exterior of the chip. Current switching transistors 311, 312 and 313 are provided, while a transistor 314 is for the current source. The transistors 311 and 312 have input terminals 315 and 316, respectively. Shown at 317 and 318 are output transistors for the interior, which have output terminals for the interior 319 and 320, respectively. $V_1$ –$V_3$ denote power sources.

Numeral 308 designates an emitter-follower transistor for an output, numeral 309 an input terminal on the base side, numeral 310 an output terminal on the emitter side, and numeral 321 a resistor for a large current as a collector load resistor. The value of resistor 321 may be 0.5K Ω, for example, and may lie within the range given above for resistor 302 and 303.

The CML gate 301 arranged at the central portion of the chip has only the resistors 302 and 303 for small currents as collector load resistors, and has the two resistors 304 and 305 for a large current and for a small current as the resistors for the current source. Where the CML gate 301 is employed as the gate for the interior of the chip, the small current-resistor 305 is used.

On the other hand, when the output of the CML gate 301 is derived outside of the chip, the large current-resistor 304 is used. The output terminal 306 or 307 of the CML gate 301 is connected to the input terminal 309 on the base side of the output emitter-follower transistor 308 which is arranged at the peripheral part of the chip.

Characteristics of the present invention are that the large current-resistor 321, as the collector load resistor, is connected to the base of the output emitter-follower transistor 308 and that the resistor 321 has its resistance selected so as to act as a large current load resistor when used in parallel with the resistor 302 or 303.

Herein, only the resistor 321 may be used by cutting off the resistor 302 or 303. In this case, the resistance is selected so that a predetermined value may be acquired with only the resistor 321.

As is apparent from the foregoing, according to the present invention, each CML gate requires only the resistors 302 and 303 for small currents as the collector load resistors.

Instead, the collector load resistor 321 is provided as the base of the output emitter-follower transistor 308. In the usual large scale integrated circuit chips employed for logic purposes, however, as the integration scale becomes larger, the ratio between the number of outputs and the number of gates becomes smaller. For example, in a chip having 200 gates, the number of outputs is approximately 30 – 50, on the average.

In a chip of 200 gates, with the prior-art construction illustrated in FIG. 2, four collector load resistors per gate are necessary, so that a total of 800 collector load resistors is required. With the construction of the present invention illustrated in FIG. 3, two collector load resistors per gate and one collector load resistor per output emitter-follower transistor are sufficient, so that only 430 – 450 collector load resistors are required. Thus, according to the present invention, the number of resistors can be reduced by 370 – 350 in comparison with that of the prior art, and the chip area can be made remarkably smaller.

As in the prior art shown in FIG. 2, the circuit of the present invention causes a large current to flow only in the gates which provide outputs outside of the chip. Therefore, the advantage of low power dissipation is not reduced.

Where only one of the output terminals 306 and 307 is required for the output, if the other terminal not used remains as in the construction of FIG. 3, the transistor 311, 312 or 313 will be saturated and the switching speed will become lower. This problem is solved by merely grounding that one of the output terminals 306 and 307 which is not used.

In the CML gate 301, often logic performance is exemplified by clamping the collectors with diodes or transistors. When such clamping is effected, the above problem is solved, and moreover, the output can be used within the chip.

Needless to say, the CML gate according to the present invention covers a variety of modified configurations as explained above.

Since, in the foregoing embodiment of FIG. 3, the current source of the CML gate 301 is a constant-current source employing the transistor 314, the resistances of the collector load resistors 302 and 303 are equal, and the values of the collector load resistors 321 may be of one type. In contrast, where the current source of the CML gate is composed only of resistors, currents flowing through the resistors 302 and 303 differ slightly in magnitude. In order to obtain fixed output voltages, therefore, the resistances of the resistors 321 connected to the bases of the output emitter-follower transistors 308 must be different for the case of using the output terminal 306 and the case of using the output terminal 307. To this end, two types of resistors may be prepared as the resistors 321 and may be made so as to be selectable.

Even in this case, the number of resistors increases only by 30 – 50, and it is smaller by 340 – 300 than in the prior art, so that the effect of the present invention is not considerably reduced.

Although the embodiment has been described for a case where the current values of the CML gates are those of a large current and a small current, it is a matter of course that the present invention is also applicable to a case where three or more current values are set.

Further, although the fundamental type is shown as the CML gate 301 in FIG. 3, various CML gates such as a cascade connection type CML gate may also be adopted.

As described above, according to the present invention, the load resistors are connected on the base side of the output emitter-follower transistors arranged at the peripheral portion of the chip, whereby the power dissipation can be made very low and the chip area can be made small.

While we have shown and described several embodiments in accordance with the present invention, it is understood that the same is not limited thereto but is susceptible of numerous changes and modifications as shown to a person skilled in the art, and We therefore do not wish to be limited to the details shown and described herein but intend to cover all such changes and modifications as are obvious to one of ordinary skill in the art.

What is claimed is:

1. In a semiconductor large scale integrated circuit chip having:

a plurality of current switching logic circuits arranged at an interior portion of said chip, each current switching logic circuit comprising:

a current source, and at least two current switching transistors, the emitters of which are connected in common to said current source; and a plurality of emitter follower transistors arranged at a peripheral portion of said chip relative to said interior portion thereof;

the improvement wherein each of said emitter follower transistors has its base connected to the collector of a current switching transistor located at said interior portion of said chip, and wherein a first collector load resistor for a current switching transistor located at said interior portion of said chip is connected to the base of each emitter-follower transistor, said first collector load resistor being located adjacent said emitter-follower transistor at the peripheral portion of said chip.

2. The improvement according to claim 1, wherein said current source includes means by which the value of current supplied by said current source can be selectively changed.

3. The improvement according to claim 1, wherein said current source includes a pair of resistors of different values selectively connectable therewith, for controlling the value of current supplied by said current source to said switching transistors, and wherein said at least two current switching transistors comprise at least one first transistor having its emitter connected to said current source, an input signal terminal connected to its base, and a second collector load resistor and a first output terminal connected to its collector, and a second transistor having its emitter connected to said current source, a reference signal terminal connected to its base, and a third collector load resistor and a second output terminal connected to its collector.

4. The improvement according to claim 1, further including second and third collector load resistors connected to the collectors of respective ones of said current switching transistors, said second and third collector load resistors being located adjacent said current switching transistors at the interior portion of said chip and having a resistance value substantially greater than the resistor value of the first collector load resistor.

5. The improvement according to claim 1, wherein said current source comprises a transistor, the collector of which is connected to the emitters of said current switching transistors, the base of which is connected to a reference potential terminal, and further includes a pair of emitter resistors, the values of which are substantially different from each other, selectively connectable with the emitter of the current source transistor.

6. The improvement according to claim 1, wherein each of said current switching logic circuits further comprises:

first and second interior output transistors, the base of each of which is connected to the collector of a current switching transistor, the collector of each of which is connected to a first source of reference potential, and the emitter of each of which is connected to through a resistor to a second source of reference potential, and is connected to an interior output terminal.

7. The improvement according to claim 6, wherein said current source includes a pair of resistors of different values selectively connectable therewith, for controlling the value of current supplied by said current source to said switching transistors, and wherein said at least two current switching transistors comprise at least one first transistor having its emitter connected to said current source, an input signal terminal connected to its base, and a second collector load resistor and a first output terminal connected to its collector, and a second transistor having its emitter connected to said current source, a reference signal terminal connected to its base, and a third collector load resistor and a second output terminal connected to its collector.

8. The improvement according to claim 3, further including second and third collector load resistors connected to the collectors of respective ones of said current switching transistors, said second and third collector load resistors being located adjacent said current switching transistors at the interior portion of said chip and having a resistance value substantially greater than the resistor value of the first collector load resistor.

9. The improvement according to claim 7, further including second and third collector load resistors connected to the collectors of respective ones of said current switching transistors, said second and third collector load resistors being located adjacent said current switching transistors at the interior portion of said chip and having a resistance value substantially greater than the resistor value of the first collector load resistor.

10. The improvement according to claim 9, wherein said current source comprises a transistor, the collector of which is connected to the emitters of said current switching transistors, the base of which is connected to a reference potential terminal, and an emitter, and further includes said pair of resistors of different values selectively connectable with the emitter of the current source transistor.

11. The improvement according to claim 8, wherein said current source comprises a transistor, the collector of which is connected to the emitters of said current switching transistors, the base of which is connected to a reference potential terminal, and further includes a pair of emitter resistors, the values of which are substantially different from each other, selectively connectable with the emitter of the current source transistor.

12. The improvement according to claim 4, wherein said current source comprises a transistor, the collector of which is connected to the emitters of said current switching transistors, the base of which is connected to a reference potential terminal, and further includes a pair of emitter resistors, the values of which are substantially different from each other, selectively connectable with the emitter of the current source transistor.

13. The improvement according to claim 3, wherein the values of said first load resistors adjacent the emitter follower transistors are respectively different from each other.

* * * * *